United States Patent [19]

Leroux

[11] Patent Number: 4,914,391
[45] Date of Patent: Apr. 3, 1990

[54] METHOD FOR FAST IMAGING BY NUCLEAR MAGNETIC RESONANCE

[75] Inventor: Patrick Leroux, Gif sur Yvette, France

[73] Assignee: General Electric CGR S.A., Issy les Moulineaux, France

[21] Appl. No.: 286,985
[22] PCT Filed: Mar. 15, 1988
[86] PCT No.: PCT/FR88/00136
§ 371 Date: Nov. 21, 1988
§ 102(e) Date: Nov. 21, 1988
[87] PCT Pub. No.: WO88/07672
PCT Pub. Date: Oct. 6, 1988

[30] Foreign Application Priority Data

Mar. 25, 1987 [FR] France .................................. 87 04132

[51] Int. Cl.⁴ .............................................. G01R 33/20
[52] U.S. Cl. .................................................. 324/309
[58] Field of Search ............... 324/300, 307, 309, 312, 324/314

[56] References Cited

U.S. PATENT DOCUMENTS 4,684,892 8/1987 Graumann ........................... 324/309
4,733,186 3/1988 Oppelt ................................... 324/309

FOREIGN PATENT DOCUMENTS 0135847 4/1985 European Pat. Off. .

OTHER PUBLICATIONS

IEEE Transactions on Nuclear Science, vol. NS-33, No. 1, Feb. 1986, IEEE, (New York, U.S.), T. C. Mills et al.: "Investigation of Partial Flip Angle Magnetic Resonance Imaging", pp. 496–600 voir chapitres NMR Intensity Model et Discussion.

Primary Examiner—Michael J. Tokar
Attorney, Agent, or Firm—Oblon, Spivak, McClelland, Maier & Neustadt

[57] ABSTRACT

Fast imaging in spin-spin relaxation time known as $T_2$ is proposed. It is shown that, instead of awaiting total restoration of longitudinal magnetization of the magnetic moments of excited particles of a body subjected to the experiment, the excitation-measurement sequences of the experiment can be made to follow each other at a higher rate on condition that the angle of tilt of said magnetization is limited to a value which is distinctly lower than 90°, at which a good signal-to-noise ratio in response is still obtained. It is shown that, with a loss of signal-to-noise ratio of only 3 dB, there is obtained a rate of image production which is four times higher.

9 Claims, 4 Drawing Sheets

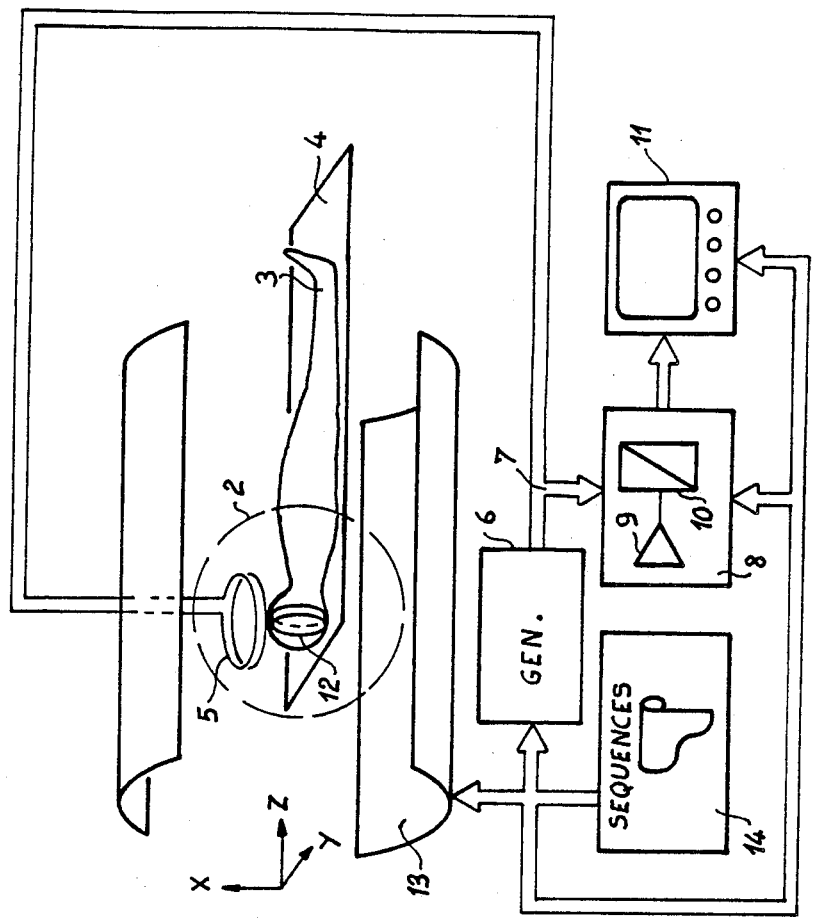
FIG_1

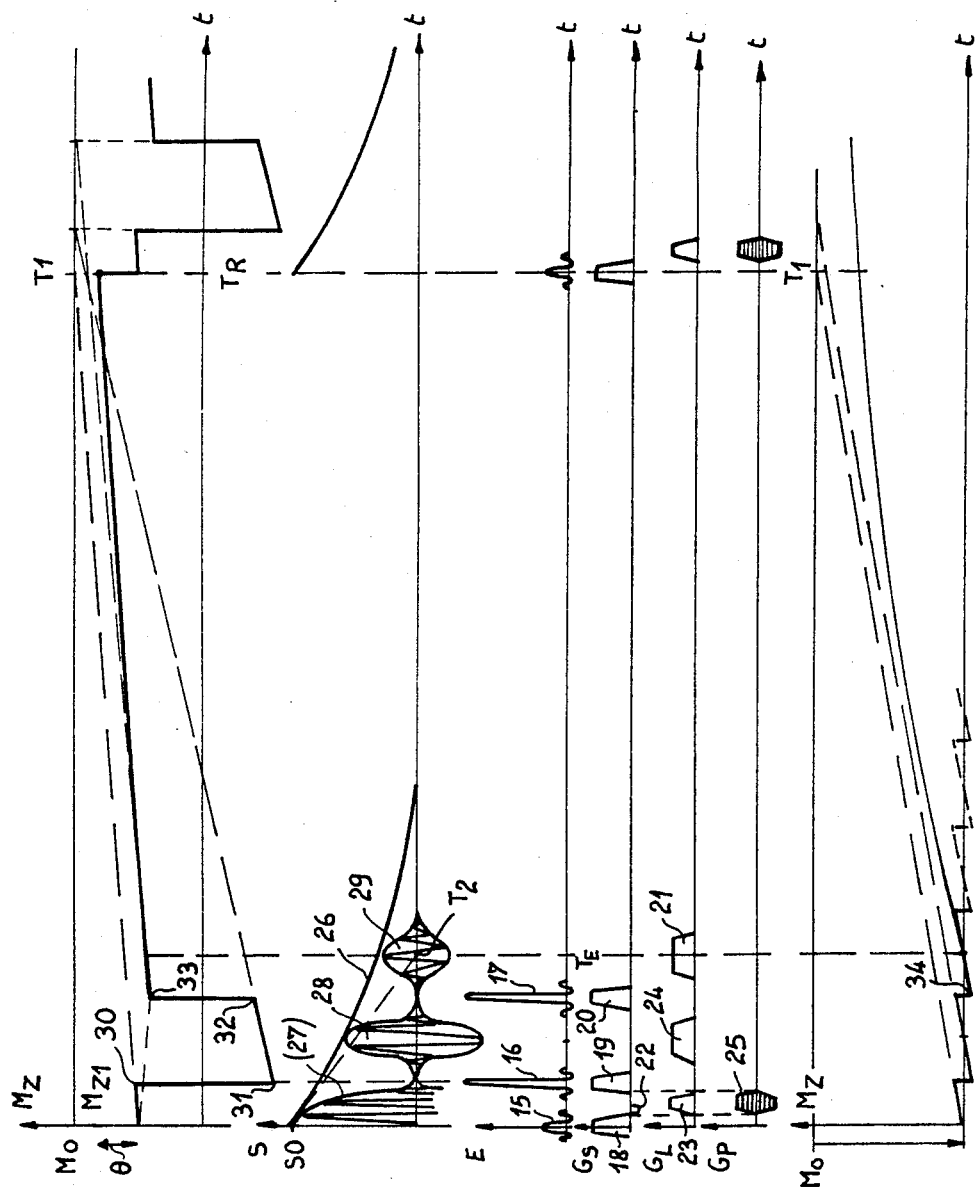

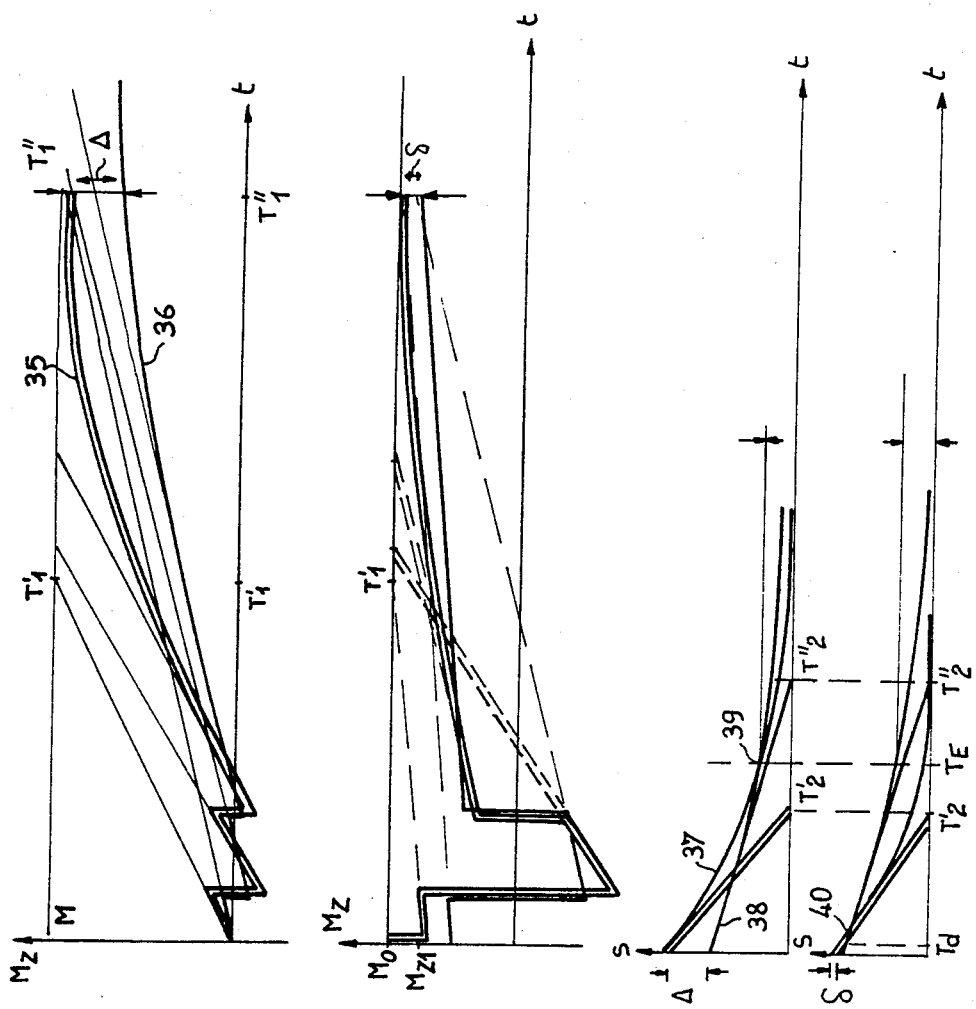

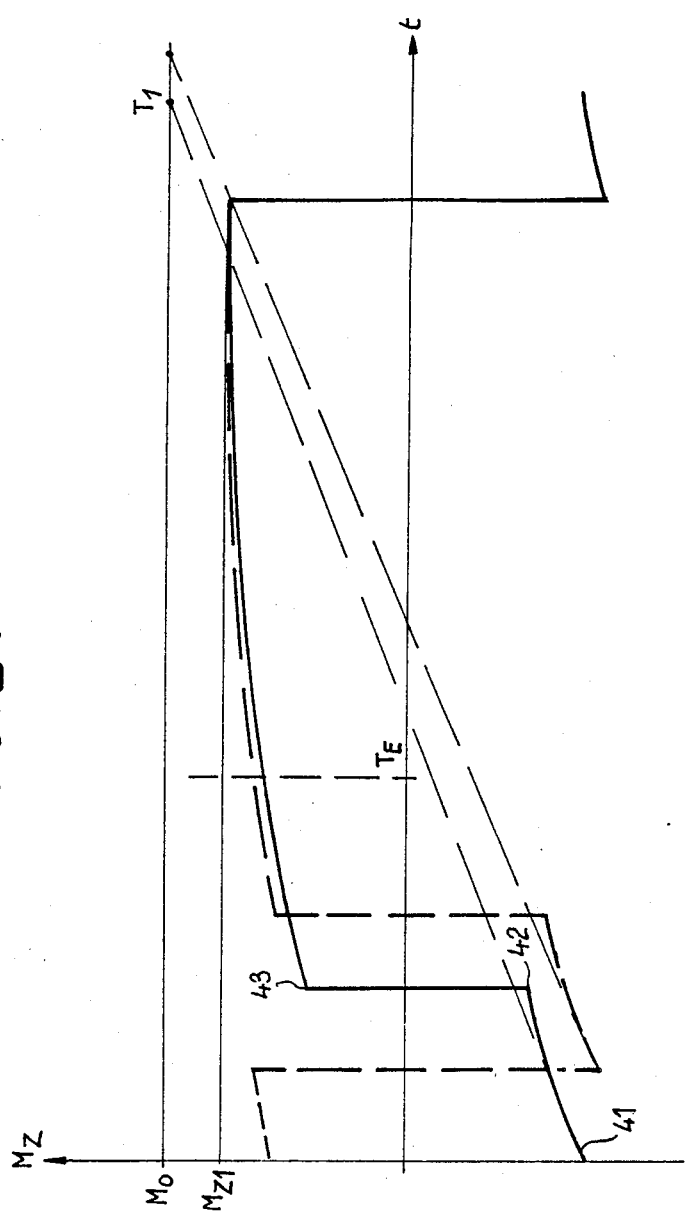
FIG_4

METHOD FOR FAST IMAGING BY NUCLEAR MAGNETIC RESONANCE

The present invention has for its object a method of fast imaging of part of a body which is subjected to an intense magnetic field known as an orienting field during a nuclear magnetic resonance (NMR) experiment. This type of experiment is at present meeting with increasing success in the medical field in which the images produced serve as aids to diagnosis, in particular to diagnosis of cancer. The application of the method according to the invention is not restricted to this field, however, and can in fact also be carried out, for example, in the field of physical measurements which also involve the use of spectrometers.

In order to obtain an image of a cross-section of a body to be examined, said body and in particular the part in which the cross-section is located, is subjected to a steady, intense and uniform magnetic field. Under the action of this field, the magnetic moments of the body particles are oriented after a few moments (in a few seconds) in the direction of the magnetic field : hence the name of orienting field which is given to said field. If the magnetic moments of the body particles are then excited with a radio-frequency magnetic excitation which oscillates at a suitable frequency, this causes angular shift of orientation of the excited magnetic moments. At the end of excitation, these magnetic moments tend to realign themselves with the orienting field in a natural movement of precession known as a free movement of precession. During this movement of precession, the particles radiate de-excitation electromagnetic energy which can be measured. The frequency of the de-excitation signal also known as the NMR signal is characteristic of the excited particles (specifically, in the medical field, the hydrogen atom contained in the water molecules disseminated throughout the human body) and of the force of the orienting field. The characteristics of the body are deduced from processing of the measured signal.

Processing of the measured signal in order to extract an image is complicated by the fact that all the particles of the body throughout the excited region reemit a de-excitation signal on completion of the excitation. It is therefore important to discriminate the contributions, in the global NMR signal, of all the elementary regions (known as voxels) of the excited volume in order to reconstruct their distribution and in fact in order to form the image. This discrimnation is possible only by carrying out a series of excitation-measurement sequences. During each sequence, the NMR signals to be measured are coded differently from one sequence to another. When the applied coding is known, the image can be reconstructed by pure imaging techniques.

Measurement of the NMR signal is in fact concerned with the amplitude of the signal. Taking account of a demodulation frequency about which the NMR signal is examined, the sole result of measurement that it can in fact be hoped to obtain is a measurement of the density, in the structures under study, of the specific particles (hydrogen), only one of the resonance frequencies of which is accordingly studied. Broadly speaking, at the end of a given time interval after excitation, the NMR signal is stronger as said density is higher. In fact, this density does not produce action solely on the original amplitude of the NMR signal. In the medical field, it is even assumed in practice that all the regions of the body make the same contribution to the NMR signal from this point of view. On the other hand, the density produces a fairly strong action on the damping, the relaxation, of said NMR signal. This damping is a complex damping : it is representative of a so-called spin-lattice interaction of the particles (the proton of the hydrogen atom) which are excited with surrounding matter and of a so-called spin-spin interaction of the protons with each other. In a known modelization of the physical phenomena which take place, it has been possible to determine that the spin-lattice relaxation time, also known as the time $T_1$, corresponds to the time constant of an exponential regrowth (re-orientation) of the component which is aligned with the orienting field (also known as the longitudinal field), of the global magnetic moment at the body location concerned. The spin-spin relaxation time known as $T_2$ also corresponds to a time constant but in this case of an exponential decay of the transverse component (orthogonal to the longitudinal component) of these magnetic moments. In an example which will be discussed below within the scope of the description of the invention, consideration will be given to a time interval $T_1$ of the order of 500 ms and to a time interval $T_2$ of the order of 100 ms : the body regions concerned will be mainly the head and more particularly the brain.

It is possible during series of experiments of different types to produce one relaxation phenomenon in preference to the other. It is then said that images are formed in $T_1$ or in $T_2$ as the case may be. The essential parameter of NMR experiments which serves in these cases is accordingly the repetition time $T_R$ which marks the periodicity of the sequences of the series of the imaging sequences employed. To simplify, if said time interval is of the order of the mean time $T_1$ of the particles located in the body parts concerned, it can be shown for two regions of said body in which the particle concentrations are such that the relaxation times $T'_1$ and $T''_1$ relating to these regions have values located on each side of the value $T_R = T_1$ (mean time) chosen, that contributions relating to these regions and made in the global NMR signal are differentiated to the maximum extent : the difference in amplitude is the best. By processing, it is then possible to trace precisely the contours of the regions at $T'_1$ and of the regions at $T''_1$. Unfortunately, this differentiation of the image in $T_1$ is not always sufficiently pertinent to discriminate sound regions (for example at $T'_1$) from diseased regions affected with cancer (for example at $T''_1$) since these latter precisely have time intervals $T_1$ which are similar to each other.

It is known that, if the image in $T_1$ is not sufficiently explicit, recourse can be hd to the image in $T_2$, the differentiation characteristics of which can be different. It is known in particular that, in the human brain, the grey matter, the white matter and tumors even more so, have well-differentiated responses in $T_2$. In practice, the measured NMR signal is only a signal corresponding to the component at right angles to the orienting field of the movement of precession of the tilted magnetic moments. Now it is known that, if the repetition time is of the same order as the mean time $T_1$, the amplitude of this signal is directly representative of the contributions in $T_1$ of the different parts of the body. In order to produce an image in $T_2$, it is necessary to await total regrowth of the magnetization (of its longitudinal component) : it is necessary to wait between each sequence for a period of time in the vicinity of three or four times the duration of $T_1$. At the end of this period, subject to the concentration of the particles (which is disregarded), it can be stated that the first measured NMR signal is dependent only on the relaxation time $T_2$. It is only if the repetition rate is too fast that the influence of the decay in $T_2$ of the NMR signal fades away before the magnitude of differentiation of the regrowths in $T_1$. At this stage of the explanation, one of the difficulties of the images in $T_2$ can immediately be perceived in the fact that they are long. In practice, they are of the order of three or four times longer than the images in $T_1$. For example in the case of an image in $T_2$ of a cross-section of the head, a patient must be subjected to experiment, without moving, for a period of seventeen minutes. In order to prevent the patient from moving, it is found necessary to hold his or her head within a frame, which makes the NMR experiment very tedious even though it remains harmless.

The invention has for its object to overcome the disadvantages mentioned above by proposing a fast image in $T_2$; in one example, it can have a duration of the order of three to four minutes while avoiding the disturbing effects of the contrast in $T_1$ in this image. In the invention, regrowth of the longitudinal component of magnetization is facilitated with a particular excitation so that the longitudinal magnetization can be considered as sufficient very rapidly, so much so, that the rate of sequences can be accelerated.

To this end, the invention is concerned with a method of fast imaging by NMR of a body subjected to an intense magnetic field or so-called orienting field of the type comprising a plurality of sequences during which :

the magnetic moments of the body particles are excited by means of a radio-frequency electromagnetic excitation in order to tilt the orientation of these magnetic moments with respect to the direction of the orienting field, the de-excitation signal resulting from this excitation is coded by means of pulses of magnetic field gradients, this resultant coded signal is measured, the measured signal is processed by decoding it so as to extract therefrom an image of part of the body, characterized in that :

the excitation comprises excitation pulses for facilitating regrowth of components, aligned with the orienting field, of magnetic moments of the particles prior to a following sequence.

The present invention will be more readily apparent from a perusal of the following description and from a study of the accompanying figures. These latter are given solely by way of indication without implying any limitation of the invention. The figures show :

FIG. 1 : a schematic representation of an NMR machine for the application of the method in accordance with the invention ;

FIG. 2(a–g) : time diagrams of physical phenomena and signals involved in a sequence of the method of the invention ;

FIGS. 3(a–3d) : time diagrams of comparison between characteristics of excitations in accordance with the invention ;

FIG. 4 : the time diagram of a variant of the method of the invention.

FIG. 1 shows an NMR machine for the application of the method in accordance with the invention. This machine comprises, schematically, means 1 for producing an intense, steady and uniform magnetic field $B_O$ in an examination region 2. A body 3 supported for example by a plate 4 is moved towards the region 2. Throughout the experiment, the body remains subjected to the magnetic field $B_O$. Excitation of the magnetic moments of the particles of the body 3 which are located in the zone 2 can be produced by means of an antenna 5 connected to a generator 6. The excitations are temporary. On completion of these excitations, the antenna 5 can serve to collect the de-excitation signal in order to convey it to receiving means 8 via a duplexer 7. The means 8 comprise in a conventional manner circuits 9 for amplification and demodulation, and processing circuits 10. The processing operation can include shaping of the signal for its representation on a display device 11. The image of a slice 12 of the body 3 can then be caused to appear on the screen of the device 11. An experiment for obtaining an image involves a plurality of excitation-measurement sequences during each of which codings are applied with gradient coils 13 to the free precession signal of the magnetic moments. These codings as well as the operation of the generator 6, of the duplexer 7 and of the receiving means 8 and display means 11 are controlled by a sequencer 14, the actions of which are organized by a program. All these elements are known per se. In particular, the sequencer 14 has the property of programmability of its sequences. It is thus possible to modify in a simple manner, in the program, the characteristics of each of the operations to be performed in the sequences in order to change the nature of the experiment undertaken.

FIGS. 2a to 2g represent time diagrams of physical quantities and of signals involved in the method of the invention. Assuming conventionally that the body 3 is aligned in an orientation Z which is collinear with the field $B_O$, the magnetic moments of the particles of said body are oriented in the direction Z. These particles therefore have a magnetization designated as $M_z$. FIG. 2a represents the shape of the modification of the value of the longitudinal component of the magnetization of each of the particles of the body 3 in the region 2 at the moment of a sequence having a time-duration $T_R$. FIGS. 2b to 2f show respectively the free precession signal S (detected by the antenna 5), the excitation signal E with the particular features of the invention (applied by the antenna 5), the pulses of selection gradient $G_S$, of reading gradient $G_L$, and of phase-coding gradient $G_P$ which are necessary for carrying out an imaging method. The gradient pulses represented here correspond to a method of imaging known by the name of 2DFT. In this method, during each sequence, excitation pulses, in this case 15 to 17, are applied in the presence of gradient pulses known as selection pulses 18 to 20 respectively. By so doing, the inception of the NMR phenomenon is restricted to a selected slice 12 perpendicular to an axis (Z) : the selection axis. At the time of reception of the de-excitation signal, a socalled reading gradient is applied by means of a pulse 21 on an axis which is perpendicular to the preceding. By reason of undesirable codings which are inherent in this method of coding, the gradient pulses 18 to 21 must be compensated by precoding pulses 22 to 24 in known manner. During each sequence, and in order to particularize each sequence, phase coding gradient pulses 25 are applied on a third axis orthogonal to the two other axes. In FIG. 2f, the pulse 25 has several levels for indicating that it varies from one sequence to the other.

A particular feature of the invention lies in the regrowth of the longitudinal magnetization of the magnetic moments. FIG. 2g shows the state of the technique relating to the images in $T_2$. Immediately at the end of the initial excitation, the amplitude $S_O$ of the free precession signal is directly related on the one hand to the sine of the angle of tilt of the magnetic moments and on the other hand to the value $M_O$ of longitudinal magnetization prior to excitation. In order to have a free precession signal which is as strong as possible, $S_O$ of the highest possible value, there is naturally chosen a so-called 90° excitation (which causes the orientation of the magnetic moment of the particles to tilt through 90°) and a sufficiently long period of time is permitted to elapse between each sequence to ensure that said longitudinal magnetization $M_z$ has reverted to its maximum value $M_O$. Since $T_1$ is the relaxation time of the longitudinal magnetization, a waiting period of practically three to four times $T_1$ is allowed to elapse before resuming a following sequence. It is of interest to observe what happens to this longitudinal magnetization when the excitation sequence employed comprises, after the 90° excitation, one or a number of 180° excitations known as spin echo excitations. In fact, in a known manner, the NMR signal does not decay, as may be expected, exponentially as indicated by the curve 26 with a time constant $T_2$. But it fades on the contrary very rapidly (27) by reason of the local inhomogeneities of the orienting field. These latter have the effect of phase-shifting the contributions of each of the parts of the slice 12 to the global NMR signal. By then applying spin echo pulses such as 16 and 17 in known manner, reappearance of the NMR signal is produced respectively at 28 and 29.

With further reference to FIG. 2g, the effect of these spin echo pulses on the longitudinal magnetization $M_z$ can be observed. Between the pulse 15 and the pulse 16, the longitudinal magnetization increases exponentially with a time constant $T_1$. At the moment of application of the excitation pulse 16, it can be considered that this magnetization is suddenly tilted through 180°, its value becomes symmetrical with its value immediately before this excitation. Between the pulse 16 and the pulse 17, the longitudinal magnetization again increases exponentially, also with a time constant $T_1$ up to the pulse 17 where it meets with the same fate. This phenomenon reoccurs as many times as there are spin echo pulses in the sequence employed It is useful to point out that the reappearance of the NMR signal at 28 or at 29 takes place substantially at a date at which the longitudinal component of the magnetic moment passes through 0 as a result of the reversals.

A study of FIG. 2a shows the immediate effect of the invention from this point of view. In this latter, at the moment of initial excitation, the magnetic moments are tilted only by a small value designated as $\theta$. In consequence, the longitudinal component of the magnetic moments begins its rise to the value $M_O$ from the value aforesaid. Its rise time constant is also $T_1$, which is characteristic of the excited particles. At the moment of the spin echo pulse 16, it is just as if the longitudinal component assumed a value 31 which is symmetrical with its value 30 prior to application of the pulse 16. During the time interval which elapses between the pulses 16 and 17, the longitudinal component increases exponentially (there again with a time constant $T_1$) to the value $M_O$. At the moment of the second spin echo excitation pulse 17, this longitudinal component is again reversed. It changes from the value 32 to the value 33. From the instant of application of the pulse 17 to the instant at which a fresh sequence is undertaken under the same conditions, the longitudinal component $M_z$ varies exponentially towards $M_O$.

The advantage obtained by the method of the invention, small tilt of the magnetization combined with a succession in an even number (in this case 2) of spin echo pulses, causes the longitudinal magnetic moment to increase from a value of 33. This latter, which is already close to the value $M_O$, is much more advantageous than the corresponding value 34 which is the starting point for magnetization with conventional initial excitation at 90°. From a practical standpoint, at the end of a time interval $T_R$ of the order of the mean time $T_1$ of the excited particles, it can be assumed that the magnetization $M_z$ has attained a sufficient value to restart a following sequence whereas this value would previously have been distinctly insufficient. In FIG. 2a, the starting value $M_z$ of the longitudinal component of the magnetic moment is not equal to $M_O$ by reason of the rapid succession of sequences. Whereas the value $M_z$ starts from $M_O$ during a very first excitation-measurement sequence, the starting value has been damped, stabilized, at the end of a few sequences, at a value $M_{z1}$ whose deviation from the value $M_O$ depends in the final analysis on the value $\theta$ employed in the experiment. In practice, it is only necessary to wait approximately ten "blank" sequences before beginning the sequences which are directly utilizable for composing the image.

FIG. 2b provides a further indication. Preferably, the signal employed for forming the image will be the NMR signal 29 although the signal 28 has an amplitude value which is higher than the signal 29. In fact, steps are preferably taken to ensure that the total echo time $T_E$ is of the order of the relaxation times $T_2$ of the different parts to be differentiated in the image. In consequence, if the signal 29 is weaker than the signal 28, it is on the other hand more highly contrasted in $T_2$ than the signal 28. Better images can be produced with the signal 29 than with the signal 28 even if these last images are somewhat noisy.

FIGS. 3a to 3d show differentiation and contrast phenomena in respect of two types of tissues contained in a region being explored and whose relaxation times $T'_1$ and $T''_1$ as well as $T'_2$ and $T''_2$ are plotted in the figures. The object of these figures is to show that the choice of a large angle of tilt (FIGS. 3a and 3c) is less favorable for contrast in $T_2$ than the choice of a small angle of tilt. In FIG. 3a which recalls FIG. 2g, there has been shown the progressive variation of the NMR signals 35 (in double lines) of tissues whose relaxation time $T'_1$ is short and 36 whose relaxation time $T''_1$ is longer : to exaggerate, it has even been assumed to have double the value. At the end of the sequence, the longitudinal magnetizations of the particles of tissues of one type and of the other type contribute, at equal density, to the NMR signal with amplitudes whose difference has the value $\Delta$. This difference in longitudinal magnetization has an effect, in FIG. 3c, on the NMR signal which is detectable with a difference which is proportional to $\Delta$. Unfortunately, the tissue which has the shortest relaxation time $T_1$ also has the shortest relaxation time $T_2$. The result thereby achieved is that the contribution 37 to the global NMR signal of this first tissue decreases more rapidly in time than the contribution 38 to the NMR signal of the other tissue. Since the contribution of this other tissue had a lower value at the outset, these two signals tend towards a common value 39 at which it is impossible to distinguish them : the differentiation in T₂ is in that case inoperative. It is known that this common signal 39 appears at a substantially intermediate date between the dates corresponding to the time constants T'₂ and T"₂ relative to these tissues. In other words, measurement of the signal 29 (FIG. 2b) takes place precisely at an instant at which there is no longer any contrast in $T_2$.

On the other hand, FIGS. 3b and 3d, the tilt is of small value. By reason of its higher time constant $T_1$, the magnetization of the second tissue does not rise to the initial magnetization $M_O$ but rises at the end of each sequence only to a value $M_{z1}$. On the other hand, the first tissue, which has a low time constant $T'_1$, returns for example to the value $M_O$. However, the divergence between these magnetizations is small : it has a value δ. This small divergence nevertheless has an effect in the measurable NMR signal after excitation. But this small divergence has the effect of "displacing" the common value, from the value 39 to the value 40. This common value is attained at a date $T_d$ now located outside the instants at which the NMR signal is measured. The result thereby achieved is that, at the moment of reading about a date $T_E$, the difference in contributions to the global NMR signal is of maximum value : the image in $T_2$ is well contrasted.

From a practical standpoint, a compromise has to be found in regard to the value of θ. In fact, if θ is too large, the contrast in $T_1$ nullifies the contrast in $T_2$. On the other hand, if θ is too small, for example of the order of only a few degrees, the signal $S_O$ (FIG. 2b) is too weak. In other words, in the first case, there will not be sufficient contrast and, in the second case, there will be excessive noise. It has been discovered by experiment and it can be verified in theory that appreciable results are obtained when the angle of tilt has a value between 30 and 60 degrees. In a preferred manner, it has a value between 30 and 45 degrees.

FIG. 4 shows an alternative form of excitation in accordance with the invention. Instead of carrying out an angular shift of small amplitude at the time of the first excitation 15 (FIG. 2c), a very substantial angular shift of orientation of the magnetic moments is initiated. While being substantial, this angular shift is nevertheless smaller than 180°. For example, it has a value of 135°. Under these conditions, the longitudinal magnetization assumes a value of 41. With such an excitation of high amplitude, it is necessary to employ only an odd number of spin echo excitations in order to restore the magnetization. In a preferred manner, there is even employed only a single excitation. At the time of this single spin echo excitation, the magnetization increases from a value of 42 to a value of 43. The measurement is carried out at the end of an echo time $T_E$ which is comparable with the preceding echo times. This amounts to considering, FIG. 2c, that an excitation 15 and an excitation 16 have been performed at the same time. If one compares a sequence with small angular shift and an even number of spin echo pulses with a sequence with large angular shift and an odd number of spin echo pulses, it is apparent that the magnetization is more effectively restored in the first solution. This is shown by the dashed-line reminder of the progressive variation of this magnetization in FIG. 4.

In the invention, the angular shifts are therefore limited so as to obtain a good signal-to-noise ratio in response. It can be shown that, with a loss of signal-to-noise ratio of only 3 db (sin 60° = ½), there is obtained a rate of image production which is four times faster. With an even smaller angle of tilt, the rate can be increased still further. The compromise to be found depends largely on the noise factor of the receiving chain employed in the NMR machine.

I claim:

1. A method of fast imaging by nuclear magnetic resonance of a body subjected to an intense magnetic orienting field, said method comprising a plurality of sequences said sequences including steps of:

orienting the magnetic moments of particles of said body in a direction imposed by said intense magnetic field wherein said magnetic moments of said particles of said body are excited by means of a radio-frequency electromagnetic excitation in order to tilt the orientation of said magnetic moments with respect to the direction said intense oriented magnetic field;

producing a de-excitation signal from said excitation of said magnetic moments;

coding said de-excitation signal by means of pulses of magnetic field gradients and outputting a resultant coded signal;

detecting said resultant coded signal and outputting a detected signal;

processing said detected signal by decoding said detected signal in order to extract an image of a part of said body wherein said electromagnetic excitation comprises excitation pulses for facilitating regrowth of components, aligned with said intense orienting magnetic field, of magnetic moments of said particles prior to a following sequence;

wherein said following sequence is characterized by said electromagnetic excitation comprising a pulse for tilting the magnetic moments through an angle which is substantially smaller than 90 degrees, followed by an even number of excitation pulses at 180 degrees wherein said even number of excitation pulses are spin echo pulses.

2. Method in accordance with claim 1, characterized in that the even number has the value of 2.

3. Method in accordance with claim 1 or 2, characterized in that the angle of tilt has a value between 30° and 60°.

4. Method in accordance with claim 3, characterized in that the angle of tilt has a value substantially of 45°.

5. A method of fast imaging by nuclear magnetic resonance of a body subjected to an intense magnetic orienting field, said method comprising a plurality of sequences said sequences including steps of:

orienting the magnetic moments of particles of said body in a direction imposed by said intense magnetic field wherein said magnetic moments of said particles of said body are excited by means of a radio-frequency electromagnetic excitation in order to tilt the orientation of said magnetic moments with respect to the direction said intense oriented magnetic field;

producing a de-excitation signal from said excitation of said magnetic moments;

coding said de-excitation signal by means of pulses of magnetic field gradients and outputting a resultant coded signal;

detecting said resultant coded signal and outputting a detected signal;

processing said detected signal by decoding said detected signal in order to extract an image of a part of said body wherein said electromagnetic excitation comprises excitation pulses for facilitating regrowth of components, aligned with said intense orienting magnetic field, of magnetic moments of said particles prior to a following sequence;

wherein said following sequence is characterized by said electromagnetic excitation comprising a pulse for tilting the magnetic moments through an angle which is substantially larger than 90 degrees, followed by an odd number of excitation pulses at 180 degrees wherein said even number of excitation pulses are spin echo pulses.

6. Method in accordance with claim 5, characterized in that the odd number has a value of 1.

7. Method in accordance with claim 5, characterized in that the angle has a value of 135°.

8. Method in accordance with claim 1 or claim 5, characterized in that the duration of the total echo time ($T_E$) defined by the dates of application of the spin echo pulses is of the order of the mean time of spin-spin relaxation of the magnetic moments of excited particles.

9. Method according to either of claims 1 or 5, characterized in that the duration ($T_r$) of each sequence is equal to or smaller than the mean duration of the spin-lattice relaxation time of the excited particles.

* * * * *